US006870231B2

(12) United States Patent
Kim et al.

(10) Patent No.: US 6,870,231 B2
(45) Date of Patent: Mar. 22, 2005

(54) LAYOUTS FOR CMOS SRAM CELLS AND DEVICES

(75) Inventors: Sung-Bong Kim, Kyunggi-do (KR); Soon-Moon Jung, Kyunggi-do (KR); Jae-Kyun Park, Kyunggi-do (KR)

(73) Assignee: Samsung Electronics Co., Ltd. (KR)

( * ) Notice: Subject to any disclaimer, the term of this patent is extended or adjusted under 35 U.S.C. 154(b) by 9 days.

(21) Appl. No.: 10/292,180

(22) Filed: Nov. 12, 2002

(65) Prior Publication Data

US 2003/0127752 A1 Jul. 10, 2003

(30) Foreign Application Priority Data

Jan. 7, 2002 (KR) ................................. 10-2002-0000677

(51) Int. Cl.[7] .......................................... H10L 31/119
(52) U.S. Cl. ...................... 257/379; 257/380; 257/381
(58) Field of Search ................................ 257/202–206, 257/365, 371, 393, 903–904

(56) References Cited

U.S. PATENT DOCUMENTS

| | | | | |
|---|---|---|---|---|
| 5,654,572 | A | 8/1997 | Kawase | 257/371 |
| 6,642,555 | B1 * | 11/2003 | Ishida | 257/202 |
| 2001/0030372 | A1 | 10/2001 | Mori et al. | 257/903 |
| 2001/0042926 | A1 | 11/2001 | Kumagai et al. | 257/903 |
| 2002/0001899 | A1 | 1/2002 | Ito | 438/231 |

FOREIGN PATENT DOCUMENTS

DE 10006643 A1 2/2000

OTHER PUBLICATIONS

Official Letter (English Translation) for corresponding German Application No. 103 00 038 0 33, May 11, 2004.

* cited by examiner

Primary Examiner—Dung A. Le
(74) Attorney, Agent, or Firm—Myers Bigel Sibley & Sajovec

(57) ABSTRACT

SRAM cells and devices are provided. The SRAM cells may share connections with neighboring cells, including ground, power supply voltage and/or bit line connections. SRAM cells and devices are also provided that include first and second active regions disposed at a semiconductor substrate. Parallel first and second gate electrodes cross over the first and second active regions. One end of the first active region adjacent to the first gate electrode is electrically connected to the second active region adjacent to the first gate electrode through a first node line parallel to the first gate electrode, and the other end of the first active region adjacent to the second gate electrode is electrically connected to the second active region adjacent to the second gate electrode through a second node line parallel to the second gate electrode. The first node line is electrically connected to the second gate electrode through a first local interconnection crossing over the first node line, and the second node line is electrically connected to the first gate electrode through a second local interconnection crossing over the second node line. Additionally, a word line may be in direct contact with gate electrodes of transfer transistors of the SRAM cells.

40 Claims, 16 Drawing Sheets

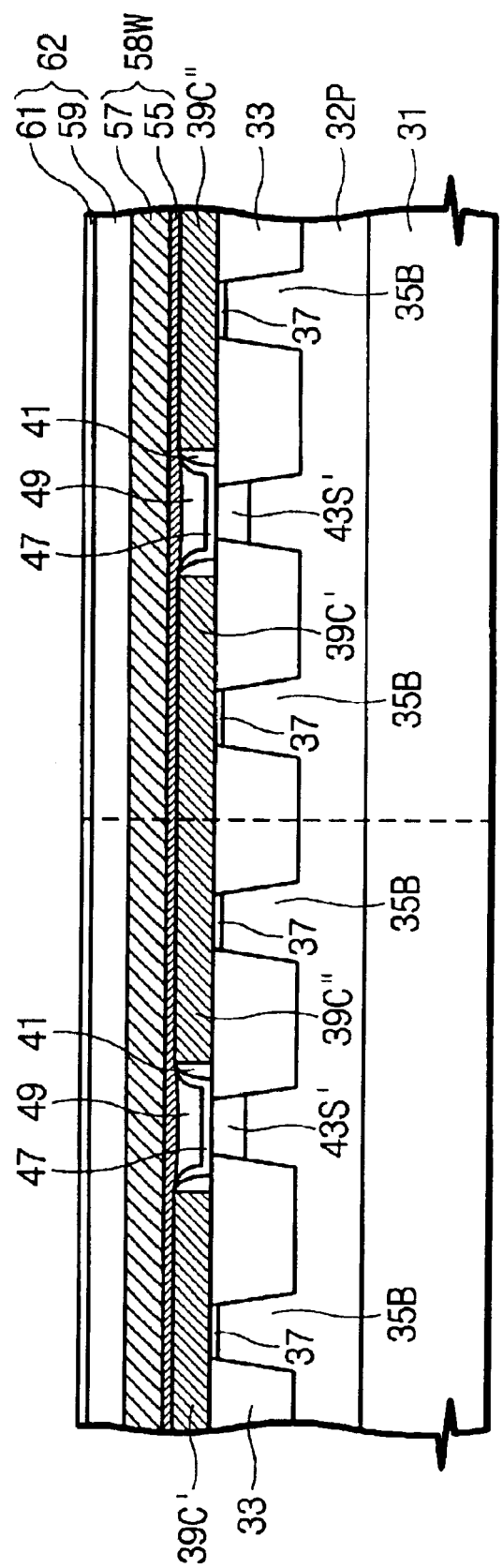

LAYOUTS FOR CMOS SRAM CELLS AND DEVICES

RELATED APPLICATION

This application claims priority from Korean Patent Application No. 2002-00677, filed on Jan. 7, 2002, the contents of which are herein incorporated by reference in their entirety.

FIELD OF THE INVENTION

The present invention relates to a semiconductor device and, more particularly, to a complementary metal-oxide-semiconductor (CMOS) static random access memory (SRAM) cell.

BACKGROUND OF THE INVENTION

Memory devices are widely used in electronic devices for storing data. Typically, such memory devices may be divided into at least two categories, dynamic random access memory (DRAM) and static random access memory (SRAM). DRAM generally has its data is periodically refreshed by rewriting the data to the memory to maintain the data. In contrast, SRAM typically does not require such a refresh. SRAM devices are widely used, for example, in cache memory of computers and portable appliances.

In general, memory cells of SRAM devices may be divided into two categories. One category includes memory cells employing load resistor as load devices of the memory cells. The other category is a CMOS type cell employing transistors as the load devices of the memory cells.

Memory devices using the CMOS type cell may be further divided into two types of cells. One is a thin film transistor (TFT) cell employing thin film transistors (TFTs) as the load devices, and the other is a full CMOS cell employing bulk transistors as the load devices. An equivalent circuit diagram of a general CMOS SRAM cell is illustrated in FIG. 1. Referring now to FIG. 1, the CMOS SRAM cell comprises a pair of driver transistors TD1 and TD2, a pair of transfer transistors TA1 and TA2, and a pair of load transistors TL1 and TL2. The pair of driver transistors TD1 and TD2 and the pair of transfer transistors TA1 and TA2 are NMOS transistors, while the pair of load transistors TL1 and TL2 are PMOS transistors.

The first driver transistor TD1 and the first transfer transistor TA1 are serially connected to each other. A source area of the first driver transistor TD1 is connected to a ground line Vss, and a drain area of the first transfer transistor TA1 is connected to a first bitline BL. Similarly, the second driver transistor TD2 and the second transfer transistor TA2 are serially connected to each other. A source area of the second driver transistor TD2 is connected to the ground line Vss, and a drain area of the second transfer transistor TA2 is connected to a second bitline /BL.

A source area and a drain area of the first load transistor TL1 are connected to a power line Vcc and a drain area of the first driver transistor TD1, respectively. Similarly, a source area and a drain area of the second load transistor TL2 are connected to the power line Vcc and a drain area of the second driver transistor TD2, respectively. A node N1 is defined at the drain region of the first load transistor TL1, the drain region of the first driver transistor TD1, and the source region of the first transfer transistor TA1. Also, a node N2 is defined at the drain region of the second load transistor TL2, the drain region of the second driver transistor TD2, and the source region of the second transfer transistor TA2. A gate electrode of the first driver transistor TD1 and a gate electrode of the first load transistor TL1 are connected to the second node N2. A gate electrode of the second driver transistor TD2 and a gate electrode of the second load transistor TL2 are connected to the first node N1. Gate electrodes of the first and second transfer transistors TA1 and TA2 are connected to a wordline WL.

The foregoing CMOS cell of FIG. 1 can exhibit a smaller stand-by current and a larger noise margin than the load resistor cell. The CMOS cell of FIG. 1 is widely used in a high-performance SRAM device, for example, in low power applications. The physical circuit corresponding to the CMOS SRAM cell shown in FIG. 1 can be constructed in various configurations at a semiconductor substrate. Conventionally, however, the full CMOS SRAM cell typically occupies a larger area than the corresponding load resistor cell or the thin film transistor (TFT) cell. Thus, improvements may be beneficial in the design of full CMOS SRAM cells.

SUMMARY OF THE INVENTION

Embodiments of the present invention provide an SRAM device having a plurality of SRAM cells. A first of the SRAM cells is mirrored about a first axis in a first direction. The first axis divides the first cell from a first adjacent cell. The first SRAM cell is also mirrored about a second axis in the first direction. The second axis divides the first cell from a second adjacent cell. The first SRAM cell is also mirrored about a third axis in a second direction substantially perpendicular to the first direction. The third axis divides the first cell from a third adjacent cell. The first SRAM cell the first adjacent SRAM cell and/or the second adjacent SRAM cell are configured to share at least one connection with the first cell. In certain embodiments of the present invention both the first cell adjacent SRAM cell and the second adjacent SRAM cell share a connection with the first SRAM cell.

In some embodiments of the present invention, a first voltage connection is shared by the first SRAM cell and the first adjacent SRAM cell. Additionally, a second voltage connection may be shared by the first SRAM cell and the second adjacent SRAM cell. Furthermore, a first bit line connection and a second bit line connection may be shared by the first SRAM cell and the second adjacent SRAM cell.

In further embodiments of the present invention, a common connection on the second axis provides a common connection to a first reference voltage for the first cell and the second adjacent cell. In particular, the first reference voltage may be a ground voltage and the common connection may be a common ground connection. In such embodiments, the common ground connection may include a first ground line on the first SRAM cell, a second ground line on the second adjacent SRAM cell and a ground contact to active regions of the first cell and the second adjacent cell, the ground contact being positioned on the second axis. A ground connector portion extends from the first ground line to the second ground line and is configured to electrically connect the first ground line and the second ground line utilizing the ground contact.

In additional embodiments of the present invention, the first reference voltage may be a power line voltage and the common connection may be a common power line connection. In such embodiment, the common power line connection may include a power line contact to active regions of the first cell and the first adjacent cell. The power line contact is positioned on the first axis. A power line on the first axis between the first SRAM cell and first adjacent SRAM cell is configured to electrically connect the power line utilizing the power line contact.

In still further embodiments of the present invention, the first SRAM cell and the first adjacent SRAM cell each include a first active region that provides first and second load transistors. The first active region is adjacent and substantially parallel to the first axis. A contact portion of the first active region extends from the first active region to the first axis.

Additionally, the first SRAM cell and the second adjacent SRAM cell may also include a second active region that provides first and second driver transistors and first and second transfer transistors. In such embodiments, the second active region may be adjacent and substantially parallel to the second axis and have a first end and a second end opposite the first end. A first contact portion of the second active region extends from the first end of the second active region to the second axis. A second contact portion of the second active region extends from the second end of the second active region to the second axis and a third contact portion of the second active region between the first contact portion and the second contact portion, extends to the second axis.

A SRAM device according to particular embodiments of the present invention also includes a first contact on the first contact portion of the first SRAM cell and on the first contact portion of the second adjacent SRAM cell. A second contact on the second contact portion of the first SRAM cell and the second contact portion of the second adjacent SRAM cell is also provided. A first bit line that is substantially perpendicular to the second axis is configured to electrically connect to the first contact portion of the first SRAM cell and the first contact portion of the second adjacent SRAM cell utilizing the first contact. A second bit line that is substantially perpendicular to the second axis is configured to electrically connect to the second contact portion of the first SRAM cell and the second contact portion of the second adjacent SRAM cell utilizing the second contact. The first bit line and the second bit line may extend to the first adjacent SRAM cell and the second adjacent SRAM cell.

In still further embodiments of the present invention, a third contact on the third contact portion of the first SRAM cell and the third contact portion of the second adjacent SRAM cell is provided. A ground line that is substantially parallel to the second axis is configured to electrically connect to the third contact portion of the first SRAM cell and the third contact portion of the second adjacent SRAM cell utilizing the third contact. A fourth contact on the contact portion of first active region the first SRAM cell and the contact portion of the first active region of the first adjacent SRAM cell may also be provided. A power line that is substantially parallel to the first axis may be configured to electrically connect to the contact portion of the first active region of the first SRAM cell and the contact portion of the first active region of the first adjacent SRAM cell utilizing the fourth contact. The power line may extend to the third adjacent SRAM cell.

In yet additional embodiments of the present invention, the first SRAM cell includes a first gate electrode of the first transfer transistor on the first contact portion of the second active region that extends in a direction substantially parallel to the second axis. A second gate electrode of the second transfer transistor on the second contact portion of the second active region extends along an axis of the first gate electrode. A word line extends in a direction substantially parallel to the second axis and is configured to electrically connect to the first gate electrode and the second gate electrode. In certain embodiments of the present invention, the wordline is directly on the first gate electrode and the second gate electrode.

Furthermore, a first ground line may be provided on the word line of the first SRAM cell. A second ground line may also be provided on the second adjacent SRAM cell adjacent and substantially parallel to the second axis. A ground contact is provided to the third contact portion of the first SRAM cell and the third contact portion of the second adjacent SRAM cell. The ground contact hole being positioned on the second axis. A ground connector portion extends from the first ground line to the second ground line and is configured to electrically connect the first ground line and the second ground line to the third contact portion of the first SRAM cell and the third contact portion of the second adjacent SRAM cell utilizing the ground contact. The first ground line and the word line may extend to the third adjacent SRAM cell.

In further embodiments of the present invention, a first gate electrode of the first driver transistor and the first load transistor is provided on the first active region and the second active region. The first gate electrode is on a first portion of the first active region and extends in a direction substantially perpendicular to the first axis to cross a portion of the second active region between the first contact portion and the third contact portion of the second active region. A second gate electrode of the second driver transistor and the second load transistor is provided on the first active region and the second active region. The second gate electrode is on a second portion of the first active region and extends in a direction substantially perpendicular to the first axis to cross a portion of the second active region between the second contact portion and the third contact portion of the second active region. A first node electrode is configured to connect the first active region to the second active region adjacent the first gate electrode and a second node electrode is configured to connect the first active region to the second active region adjacent the second gate electrode.

Additionally, a first contact to the first node electrode may be provided. The first contact may be positioned over the second active region and a region of a substrate adjacent the second active region. A second contact may be provided to the second gate electrode of the second load transistor. The second contact may be positioned over the second active region and a region of a substrate adjacent the second active region. A third contact may be provided to the second node electrode. The third contact may be positioned over the first active region and a region of a substrate adjacent the first active region. A fourth contact may be provided to the first gate electrode of the first driver transistor. The fourth contact may be positioned over the first active region and a region of a substrate adjacent the first active region. A first node line is configured to electrically connect the first node electrode to the second gate electrode of the second load transistor utilizing the first and second contacts. A second node line is configured to electrically connect the second node electrode to the first gate electrode of the first driver transistor utilizing the third and fourth contacts. The first node line and the second node line may be substantially parallel to the first axis.

In additional embodiments of the present invention, a first contact is provided to the first node electrode. The first contact is positioned over the first active region and a region of a substrate adjacent the first active region. A second contact is provided to the second gate electrode of the second driver transistor. The second contact is positioned over the first active region and a region of a substrate adjacent the first active region. A third contact is provided to the second node electrode. The third contact is positioned over the second active region and a region of a substrate adjacent the second active region. A fourth contact is provided to the first gate electrode of the first load transistor. The fourth contact is positioned over the second active region and a region of a substrate adjacent the second active region. A first node line is configured to electrically connect the first node electrode to the second gate electrode of the second driver transistor utilizing the first and second contacts. A second node line is configured to electrically connect the second node electrode to the first gate electrode of the first load transistor utilizing the third and fourth contacts.

In further embodiments of the present invention, a SRAM cell includes first and second active regions disposed at a semiconductor substrate. A pair of gate electrodes, i.e., first and second gate electrodes, cross over the first and second active regions. The first and second gate electrodes are parallel to each other. Thus, a pair of load transistors are formed in the first active region, and a pair of driver transistors are formed in the second active region. As a result, the first active region between the first and second gate electrodes corresponds to a common source line to which a power supply voltage is applied. In some embodiments, the portion of first active region adjacent the first gate electrode and opposite to the power source region corresponds to a drain region of the first load transistor and the portion of the first active region adjacent the second gate electrode and opposite the power source region corresponds to a drain region of the second load transistor. Similarly, the second active region between the first and second gate electrodes may be a ground source region. In some embodiments, the portion of the second active region adjacent the first gate electrode and opposite the ground source region corresponds to a drain region of the first driver transistor and the portion of the second active region adjacent the second gate electrode and opposite the ground source region corresponds to a drain region of the second driver transistor.

The drain region of the first load transistor is electrically connected to the drain region of the first driver transistor through a first node line. Thus, the first load transistor and the first driver transistor are serially connected to constitute a first inverter. The first node line is substantially parallel to the first gate electrode. The first node line may be in contact with a top surface of a device isolation layer between the first and second active regions. The drain region of the second load transistor is electrically connected to the drain region of the second driver transistor through a second node line. Thus, the second load transistor and the second driver transistor are serially connected to constitute a second inverter. The second node line is substantially parallel to the second gate electrode. The second node line may be in contact with a top surface of a device isolation layer between the first and second active regions. A first local interconnection crosses over the first node line and the second gate electrode. One end of the first local interconnection is electrically connected to the first node line through a first node contact hole exposing a predetermined region of the first node line. The other end of the first local interconnection is electrically connected to the second gate electrode through a second node contact hole exposing a predetermined region of the second gate electrode. Also, a second local interconnection crosses over the second node line and the first gate electrode. One end of the second local interconnection is electrically connected to the second node line through a third node contact hole exposing a predetermined region of the second node line. The other end of the second local interconnection is electrically connected to the first gate electrode through a fourth node contact hole exposing a predetermined region of the first gate electrode. Thus, the first and second inverters are cross-coupled to constitute a single latch circuit.

The first and second node contact holes may overlap with the second active region. Also, the third and fourth node contact holes may overlap with the first active region.

According further embodiments of the present invention, first and second active regions are disposed at a semiconductor substrate. First and second gate electrodes cross over the first and second active regions. The first and second gate electrode may be substantially parallel to each other. The second active region includes a driver transistor active region substantially parallel to the first active region and first and second transfer transistor active regions that extend from both ends of the driver transistor active region opposite the first active region.

A straight wordline crosses over the first and second transfer transistor active regions. The wordline may be substantially perpendicular to the first and second gate electrodes. A third gate electrode is provided between the wordline and the first transfer transistor active region. A top surface of the third gate electrode is in direct contact with the wordline. Similarly, a fourth gate electrode is provided between the wordline and the second transfer transistor active region. A top surface of the fourth gate electrode is in direct contact with the wordline. The third and fourth gate electrodes are separated from each other in one cell and are electrically connected to each other through the wordline.

According to still further embodiments of the present invention, first and second active regions are disposed at a semiconductor substrate. The second active region includes a driver transistor active region substantially parallel to the first active region, a ground source region extending from the center of the driver transistor active region opposite the first active region, and first and second transfer transistor active regions extending from both ends of the driver transistor active region opposite the first active region. A ground line crosses over the first and second transfer transistor active regions. A predetermined region of the ground line extends to a neighboring cell so that two parallel ground lines disposed on two adjacent cells are electrically connected to each other. An extension of the ground line is electrically connected to the ground source region through a ground line contact hole exposing a predetermined region of the ground source region.

In additional embodiments of the present invention, an SRAM cell includes a first metallization layer that includes gate electrodes for first and second transfer transistors, first and second driver transistors and first and second load transistors. A second metallization layer includes first and second node line interconnections and a wordline. The first node interconnection line is configured to electrically connect the first transfer transistor, the first load transistor and the first driver transistor. The second node interconnection line is configured to electrically connect the second transfer transistor, the second load transistor and the second driver transistor. A third metallization layer includes first and second local interconnections, power line and ground line connections. The first local interconnection is configured to electrically connect the first node line to the gate electrodes of the second driver transistor and the second load transistor.

The second local interconnection is configured to electrically connect the second node line to the gate electrodes of the first driver transistor and the first load transistor.

In further embodiments of the present invention, the gate electrodes of the first driver transistor and the first load transistor are provided by a first common electrode and the gate electrodes of the second driver transistor and the second load transistor are provided by a second common electrode. The first common electrode and the second common electrode may be substantially parallel to each other. The gate electrodes of the first and second transfer transistors may be provided by first and second separate electrodes, where the first and second separate electrodes are substantially perpendicular to the first and second common electrodes. The first and second node line interconnections may also be substantially parallel to the first and second common electrodes. The word line may be substantially parallel to the first and second separate electrodes and may be directly on the gate electrodes of the first and second transfer transistors. The first and second local interconnections may be substantially perpendicular to the first and second common gate electrodes and the first and second node line interconnections.

A fourth metallization layer may also be provided that include first and second bit lines that contact the first and second common gate electrodes, respectively. Connections to the first and second bit lines may be made at an axis dividing the SRAM cell from an adjacent SRAM cell and may be shared by the adjacent SRAM cell.

In some embodiments of the present invention, the power line is disposed at a periphery of the SRAM cell along an axis that divides the SRAM cell from an adjacent SRAM cell and is shared with the adjacent SRAM cell. Also, the ground line may be provided by a first ground line on the word line of the SRAM cell and a ground connector portion that extends from the first ground line to an axis that divides the SRAM cell from an adjacent SRAM cell. The ground connector portion may be configured to electrically connect the first ground line to the SRAM cell utilizing a contact that is shared with the adjacent SRAM cell.

BRIEF DESCRIPTION OF THE DRAWINGS

FIG. 7A through FIG. 11A are cross-sectional views, taken along a line I—I of FIG. 6, for explaining methods of fabricating full CMOS SRAM cells according to embodiments of the present invention.

FIG. 7B through FIG. 11B are cross-sectional views, taken along a line II—II of FIG. 6, for explaining methods of fabricating the full CMOS SRAM cells according to embodiments of the present invention.

FIG. 7C through FIG. 11C are cross-sectional views, taken along a line II—II of FIG. 6, for explaining methods of fabricating the full CMOS SRAM cells according to embodiments of the present invention.

DESCRIPTION OF THE PREFERRED EMBODIMENT

Figure 1:
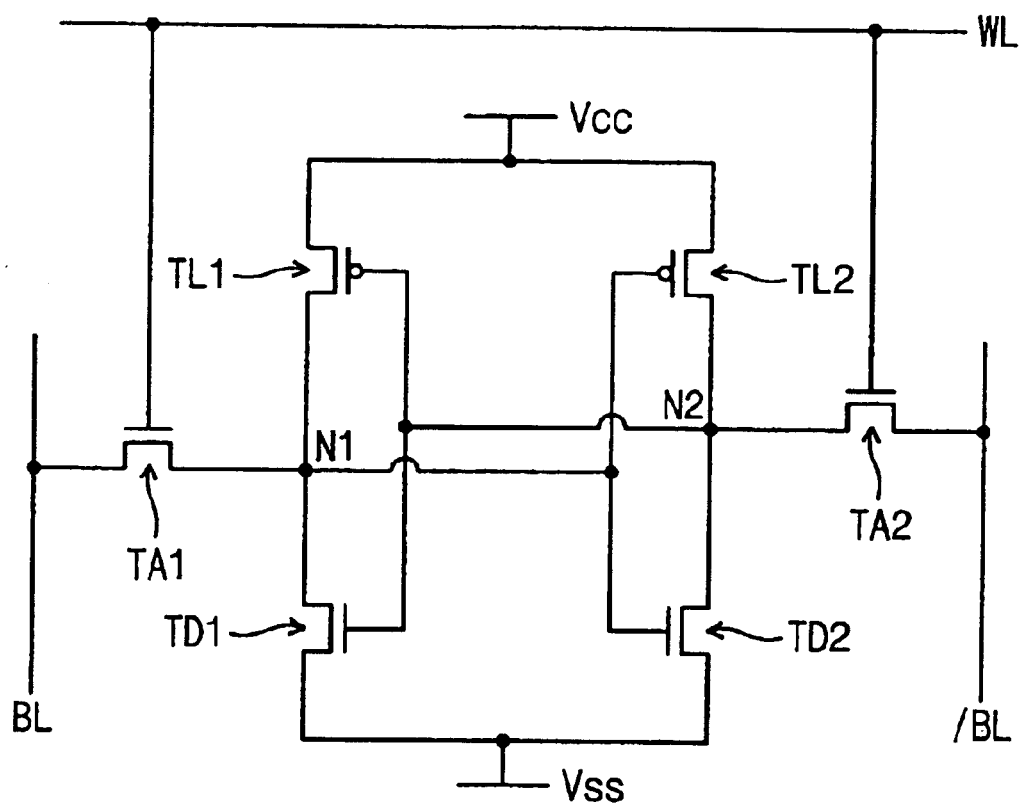
FIG. 1 is an equivalent circuit diagram of a full CMOS SRAM cell.

The present invention will now be described more fully hereinafter with reference to the accompanying drawings, in which preferred embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. Like numbers refer to like elements throughout.

FIG. 2 through FIG. 6 are top plan views illustrating a full CMOS SRAM cell according to embodiments of the present invention. Each figure illustrates four unit cells. However, additional unit cells with corresponding relationships may also be provided. In the unit cells illustrated in the figures, unit cells that are adjacent each other are divided by an axis and are mirrored about that axis. Such a mirroring may occur in the horizontal and/or vertical directions around an axis dividing adjacent unit cells. Thus, for example, a first unit cell may be adjacent a second unit cell such that the first and second unit cells are mirror images of each other and are mirrored about an axis that divides the two unit cells.

In FIG. 2 through FIG. 6, two unit cells, which are adjacent to each other along y-axis, are disposed to be symmetrical with respect to x-axis. Similarly, two unit cells that are adjacent to each other along the x-axis may be symmetrical with respect to the y-axis. The two unit cells that are adjacent to each other along the y-axis may be arrayed along both the x-axis and the y-axis to provide a cell array region having additional cells. Similarly, two unit cells that are adjacent to each other along the x-axis may be symmetrical with respect to the y-axis.

Figure 2:
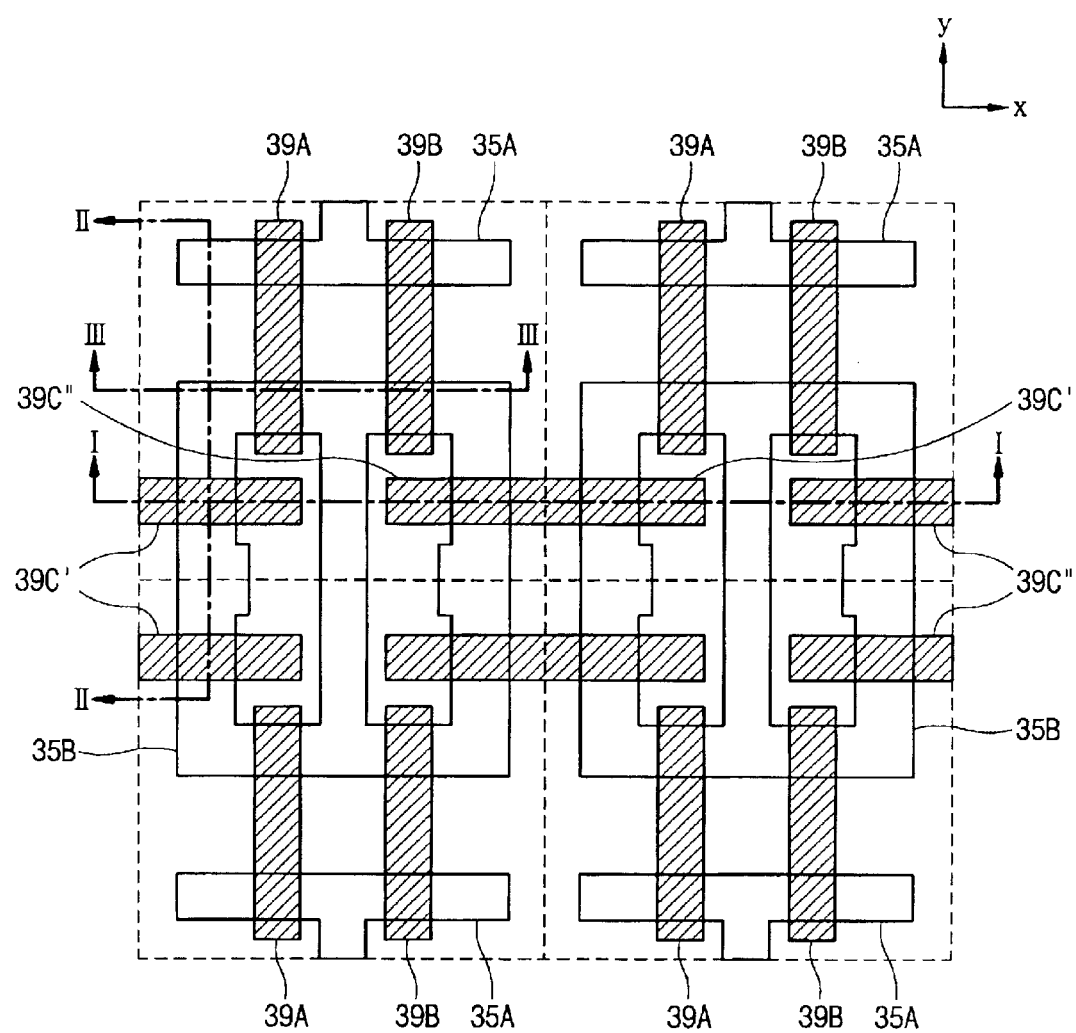
FIG. 2 is a top plan view showing active regions and gate electrodes of full CMOS SRAM cells according to embodiments of the present invention.

Referring now to FIG. 2, first and second active regions 35A and 35B are disposed at a semiconductor substrate and are spaced apart from each other. The first active region 35A is disposed parallel to the x-axis, and the second active region 35B is disposed to be adjacent to the first active region 35A. A first gate electrode 39A is disposed to cross over the first and second active regions 35A and 35B. Also, a second gate electrode 39B is disposed to cross over the first and second active regions 35A and 35B. The first and second gate electrodes 39A and 39B are disposed parallel to each other. Thus, first and second load transistors (TL1 and TL2 of FIG. 1) are constructed at the first active region 35A. Similarly, first and second driver transistors (TDI and TD2 of FIG. 1) are formed at the second active region 35B. The first active region 35A between the first and second gate electrodes 39A and 39B includes an extension that extends to a neighboring cell, and acts as a common source region of the first and second load transistors TL1 and TL2. A power supply voltage is applied to the common source region.

The second active region 35B includes a driver transistor active region and a ground source region. The driver transistor active region is parallel to the first active region 35A and is disposed across the first and second gate electrodes 39A and 39B. The ground source region is extended from the driver transistor active region between the first and second gate electrodes 39A and 39B. In addition, the second active region 35B includes first and second transfer active regions extended from both ends of the driver transistor active region. The ground source region and the first and second transfer transistor active regions are opposite to the first active region 35A within each cell and extended to be in contact with corresponding regions of a neighboring cell. The ground source region corresponds to a common source region of the first and second driver transistors TD1 and TD2.

A third gate electrode 39C' is disposed across a first region of the second active region 35B, i.e., a predetermined region of the first transfer transistor active region. A fourth gate electrode 39C" is disposed across a second region of the second active region 35B, i.e., a predetermined region of the second transfer transistor active region. As a result, a first transfer transistor (TA1 of FIG. 1) is constructed at the first transfer transistor active region, and a second transfer transistor (TA2 of FIG. 1) is constructed at the second transfer transistor active region. The third and fourth gate electrodes 39C' and 39C" are disposed parallel to the x-axis. The third and fourth gate electrodes 39C' and 39C" are also configured to extend to adjacent cells. The ground source region may be disposed to pass through a region between the third and fourth gate electrodes 39C' and 39C".

In certain embodiments of the present invention, the first and second load transistors TL1 and TL2 are PMOS transistors and the first and second transfer transistors TD1 and TD2 and first and second transfer transistors TA1 and TA2 are NMOS transistors. In some embodiments, the first through fourth gate electrodes 39A, 39B, 39C', and 39C" are formed of a first conductive layer.

Figure 3:
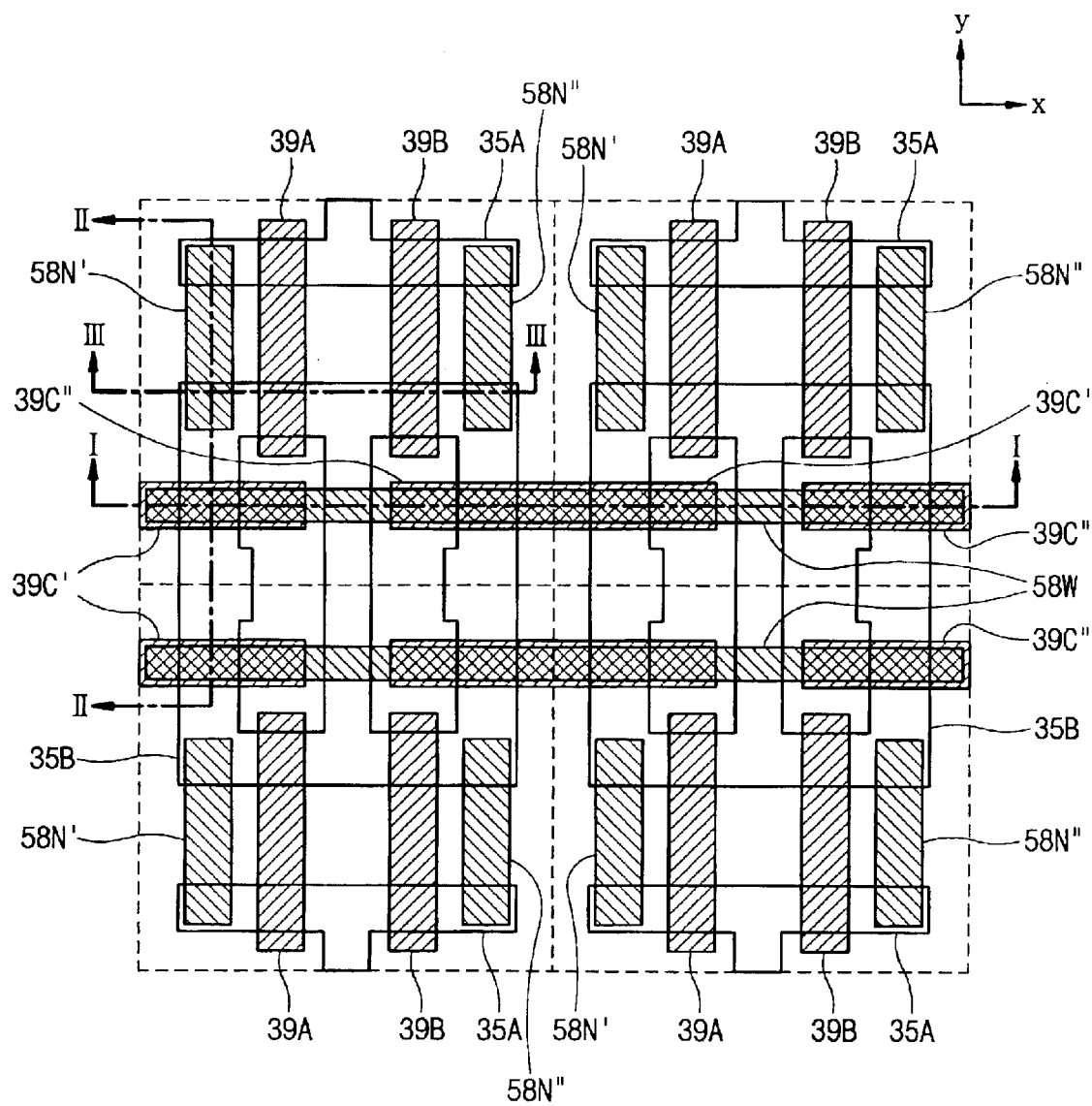
FIG. 3 is a top plan view showing node lines and wordlines of the full CMOS SRAM cells according to embodiments of the present invention.

Referring to FIG. 3, one end of the first active region 35A adjacent to the first gate electrode 39A is electrically connected to the second active region between the first and third gate electrodes 39A and 39C' through a first node line 58N'. Accordingly, the first load transistor TL1 and the first driver transistor TD1 are serially connected to each other to constitute a first inverter. The first node line 58N' is disposed parallel to the first gate electrode 39A. Preferably, the first node line 58N' is in direct contact with a top surface of a device isolation layer (not shown) between the first and second active regions 35A and 35B. Similarly, the other end of the first active region 35A adjacent to the second gate electrode 39B is electrically connected to the second active region 35B between the second and fourth gate electrodes 39B and 39C" through a second node line 58N". Accordingly, the second load transistor TL2 and the second driver transistor TD2 are serially connected to each other to constitute a second inverter. The second node line 58N' is disposed parallel to the second gate electrode 39B. Preferably, the second node line 58N" is in direct contact with a top surface of a device isolation layer between the first and second active regions 35A and 35B. Further, a straight wordline 58W is disposed over the third and fourth gate electrodes 39C' and 39C". The wordline 58W is parallel to the x-axis, and is in direct contact with top surfaces of the third and fourth gate electrodes 39C' and 39C". Thus, the third and fourth gate electrodes 39C' and 39C" are electrically connected to each other through the wordline 58W. In some embodiments, the first and second node lines 58N' and 58N" and the wordline 58W are formed of a second conductive layer. As a result, a contact resistance between the wordline 58W and the third and fourth gate electrodes 39C' and 39C" may be reduced which may result in enhanced access speed in a read mode or a write mode.

Figure 4:
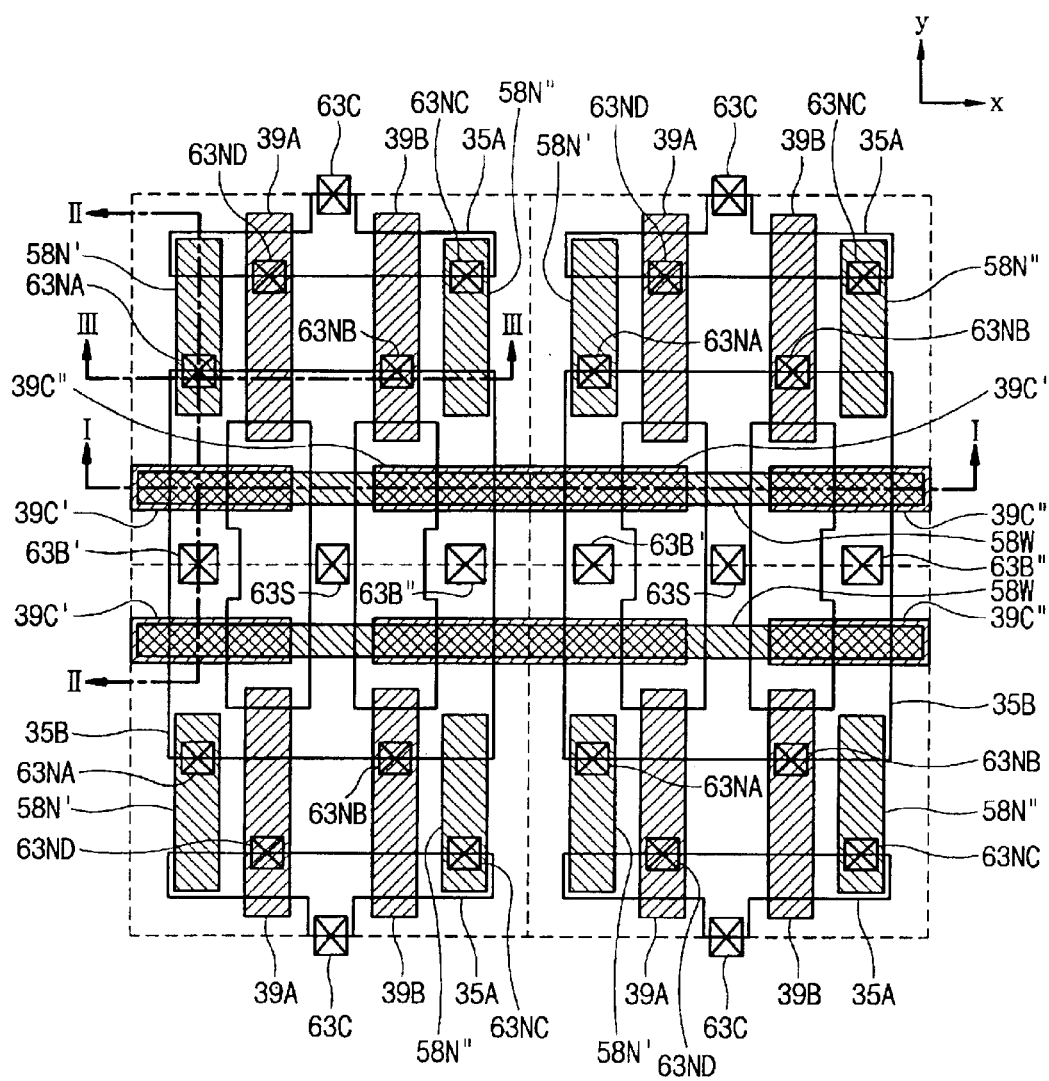
FIG. 4 is a top plan view showing node contact holes, power line contact holes, ground line contact holes, and bitline pad contact holes of the full CMOS SRAM cells according to embodiments of the present invention.

Referring to FIG. 4, a predetermined region of the first node line 58N' is exposed by a first node contact hole 63NA, and a predetermined region of the second gate electrode 39B is exposed by a second node contact hole 63NB. Also a predetermined region of the second node line 58N" is exposed by a third node contact hole 63NC, and a predetermined region of the first gate electrode 39A is exposed by a fourth node contact hole 63ND. Among the first and second node contact holes 63NA and 63NB, at least the second node contact hole 63NB may be disposed to overlap with the second active region 35B. Similarly, among the third and fourth node contact holes 63NC and 63ND, at least the fourth node contact hole 63ND may be disposed to overlap with the first active region 35A.

An extension of the first active region 35A is exposed by a power line contact hole 63C that is shared by two cells adjacent to each other. An end of the ground source region is exposed by a ground line contact hole 63S that is also shared by the two cells adjacent to each other. In addition, ends of the first and second transfer transistor active regions are exposed by first and second bitline pad contact holes 63B' and 63B" that are shared by the two cells adjacent to each other.

Contact plugs may fill the first through fourth node contact holes 63NA, 63NB, 63NC and 63ND, the power line contact hole 63C, the ground line contact hole 63S, and the first and second bitline pad contact holes 63B' and 63B".

As described above, the full CMOS SRAM cell according to embodiments of the present invention may include eight contact holes. Among the eight contact holes, four contact holes are shared by two cells adjacent to each other. Thus, a compact cell can be realized. In some embodiments, the contact holes may all be formed in a single photolithography step.

Figure 5:
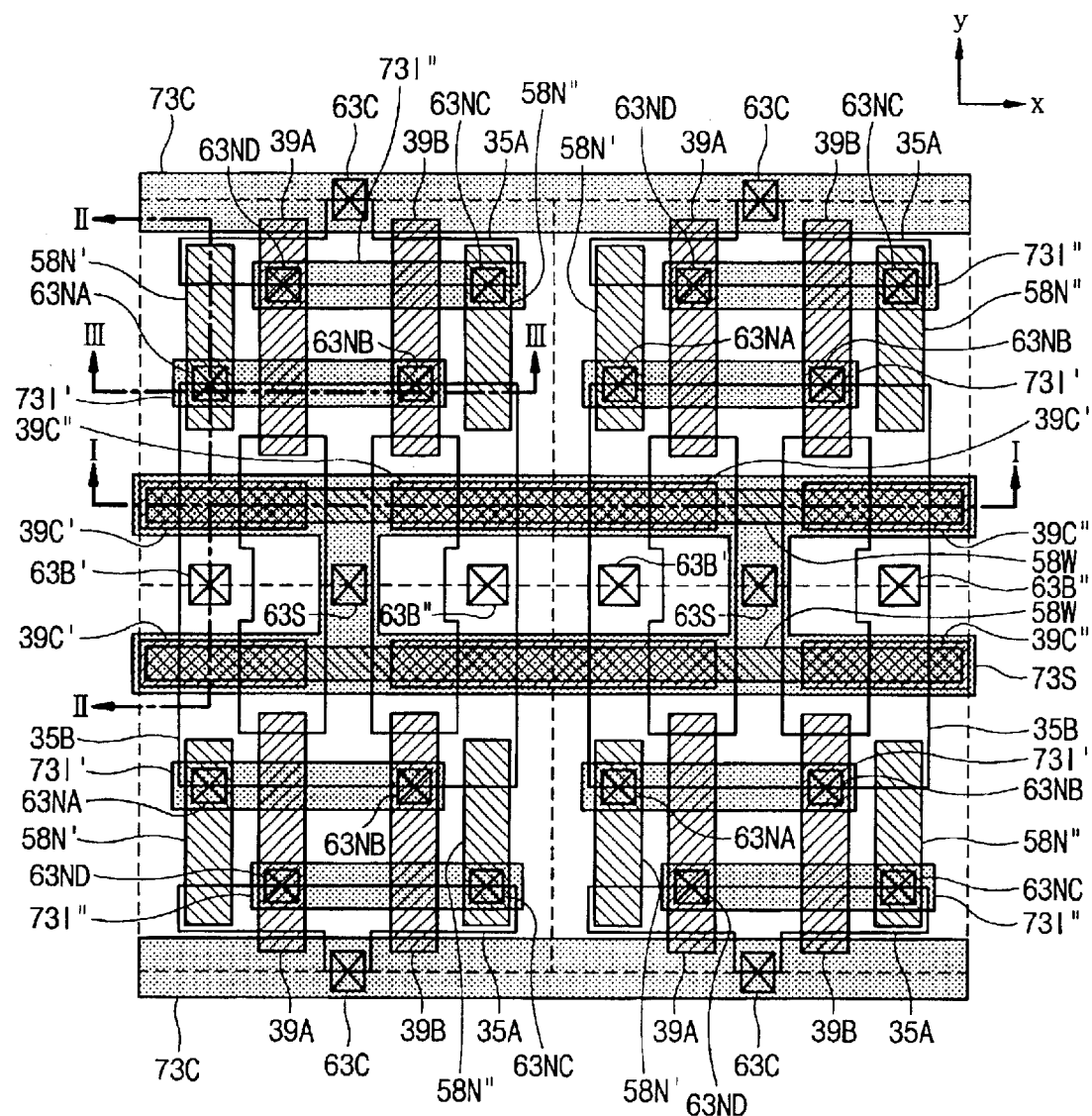
FIG. 5 is a top plan view showing local interconnections, power lines, and ground lines of the full CMOS SRAM cells according to embodiments of the present invention.

Referring now to FIG. 5, the first and second node contact holes 63NA and 63NB are covered with a first local interconnection 73I'. Therefore, the first node line 58N' is electrically connected to the second gate electrode 39B through the first local interconnection 73I'. The first local interconnection 73I' is disposed parallel to the wordline 58W across the first node line 58N' and the second gate electrode 39B. Similarly, the third and fourth node contact holes 63NC and 63ND are covered with the second local interconnection 73I". Therefore, the second node line 58N" is electrically connected to the first gate electrode 39A through the second local interconnection 73I". The second local interconnection 73I" is disposed parallel to the wordline 58W across the second node line 58N" and the first gate electrode 39A. As a result, the first and second inverters are cross-coupled by the first and second local interconnections 73I' and 73I" to realize a latch circuit. The first and second local interconnections 73I' and 73I" are formed of a conductive layer that is different from that of the first and second node lines 58N' and 58N", so that a cell area can be reduced. Furthermore, the power line contact hole 63C is covered by a power line 73C that is disposed parallel to the wordline. The power line 73C is shared by adjacent cells. A ground line 73S is disposed over the wordline 58W and is parallel to the wordline 58W. A predetermined region of the ground line 73S is extended to cover the ground line contact hole 63S. Accordingly, the two ground lines 73S disposed over the two adjacent cells are electrically connected to each other and are electrically connected to the ground source region through the ground line contact hole 63S. As a result, the two adjacent cells share two ground lines 73S. That is, each cell is electrically connected to two ground lines 73S. Thus, a ground line resistance connected to each cell may be reduced which may stabilize cell characteristics, such as a low voltage characteristic.

In some embodiments, the first and second local interconnections 73I' and 73I", the power line 73C, and the ground line 73S are formed of a third conductive layer.

Figure 6:
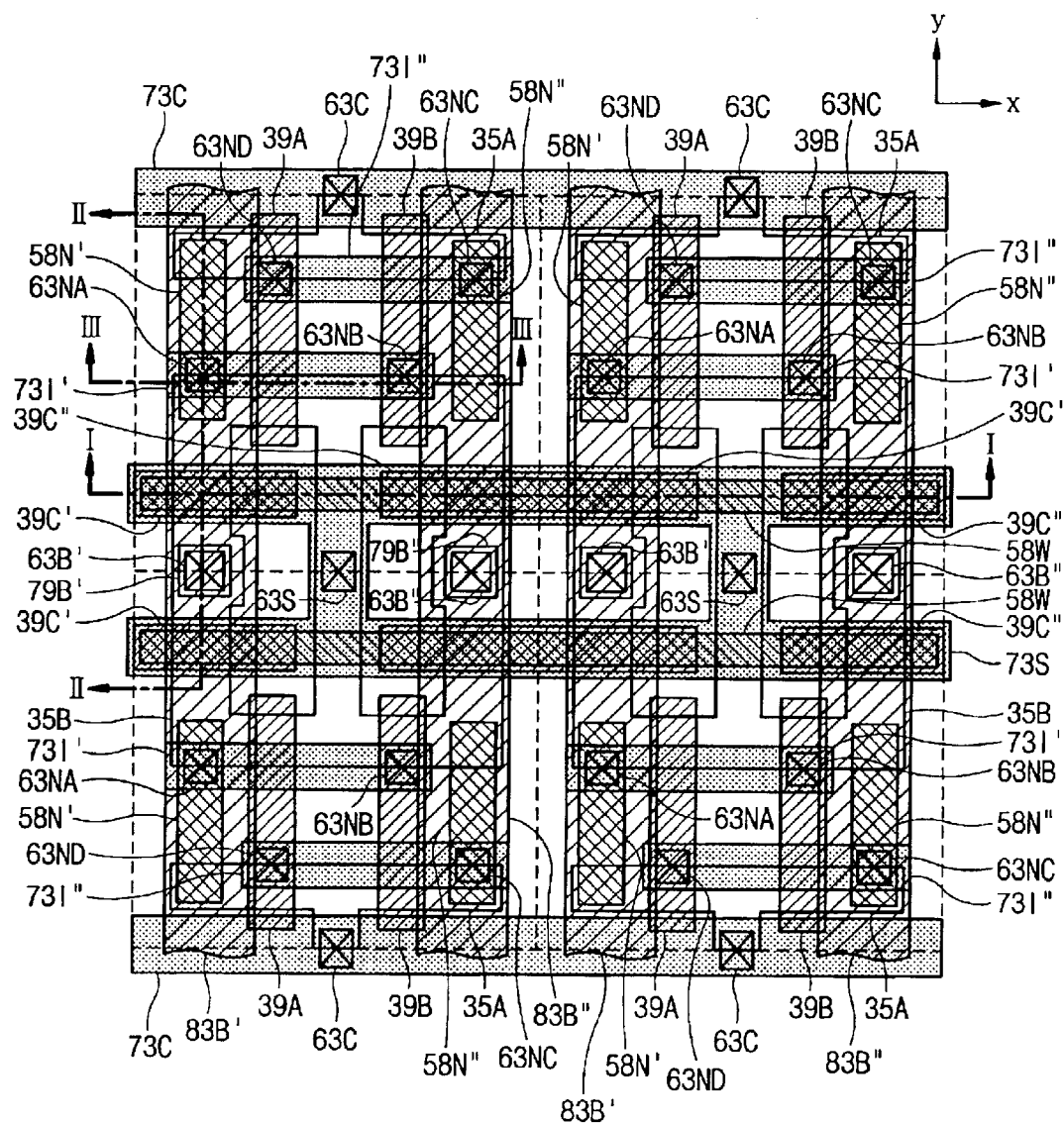
FIG. 6 is a top plan view showing bitline contact holes and bitlines of the full CMOS SRAM cells according to embodiments of the present invention.
Figure 7A:
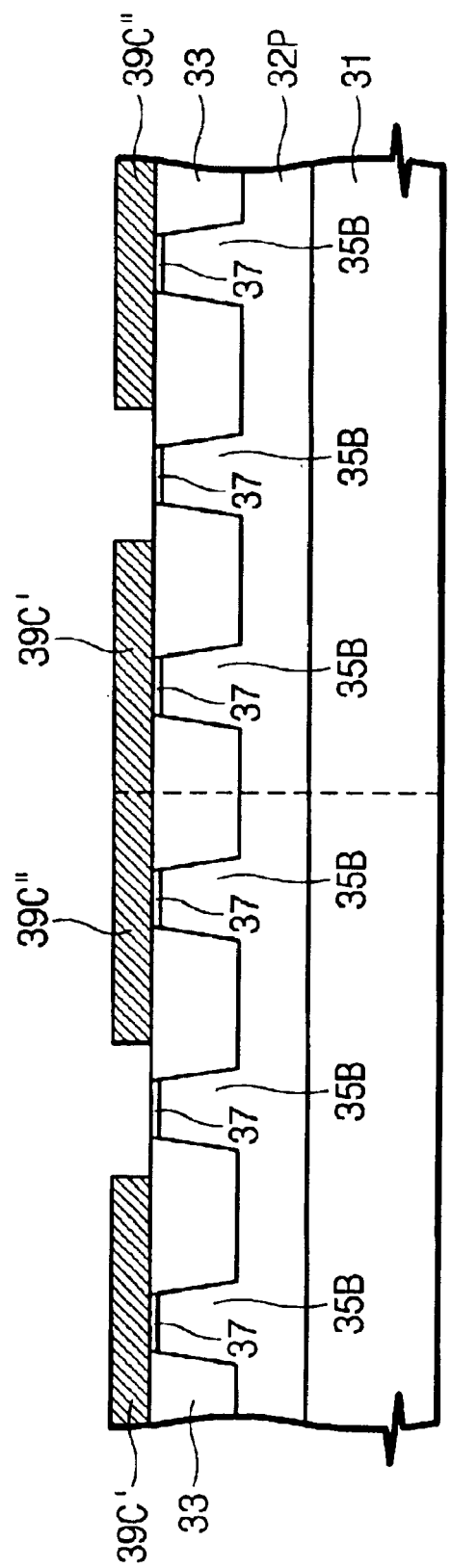
Figure 7B:
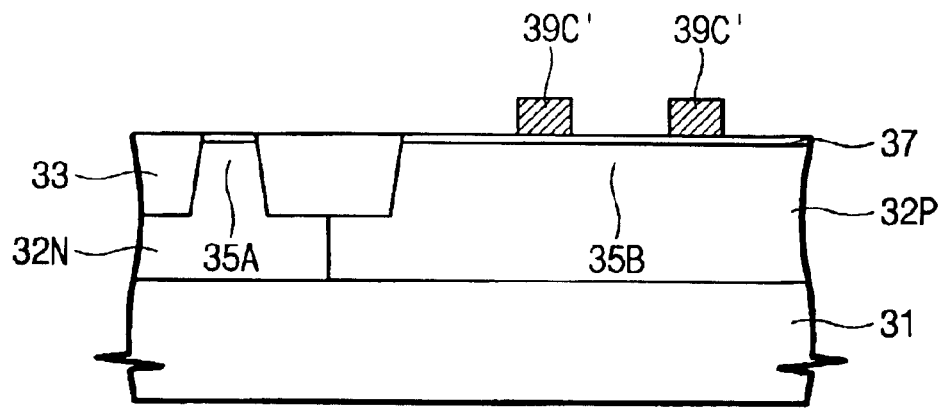
Figure 7C:
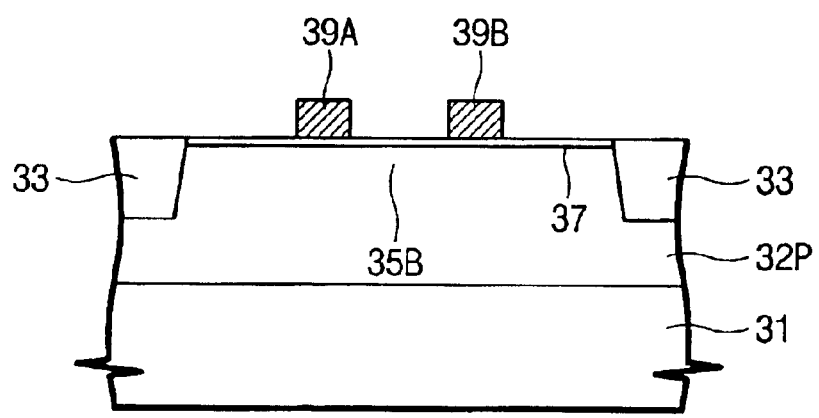
Figure 8A:
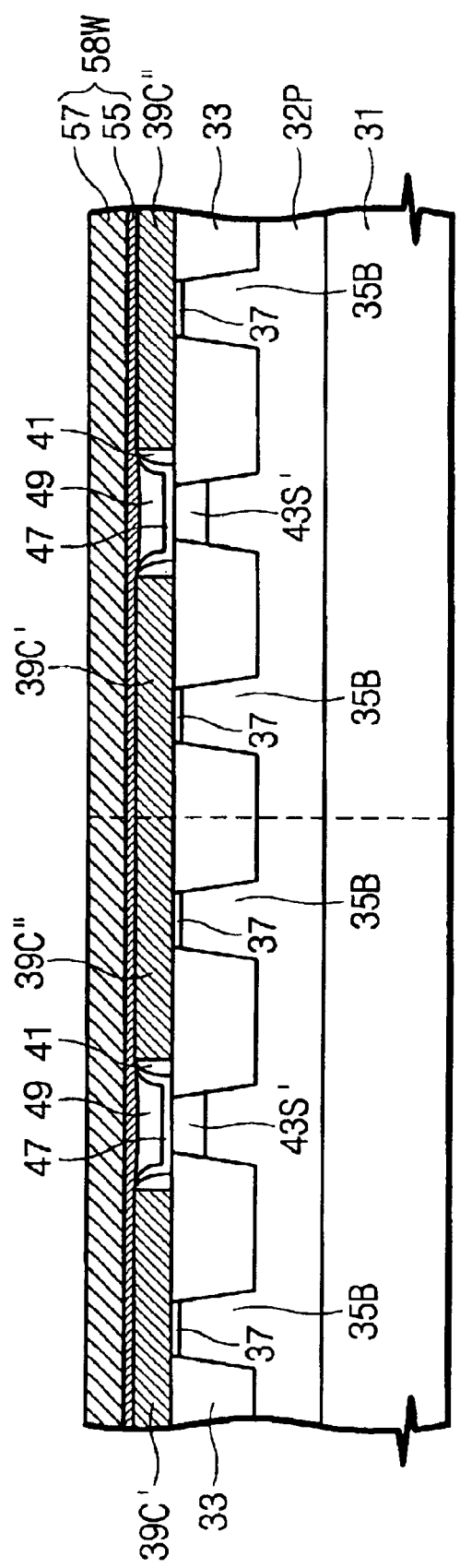
Figure 8B:
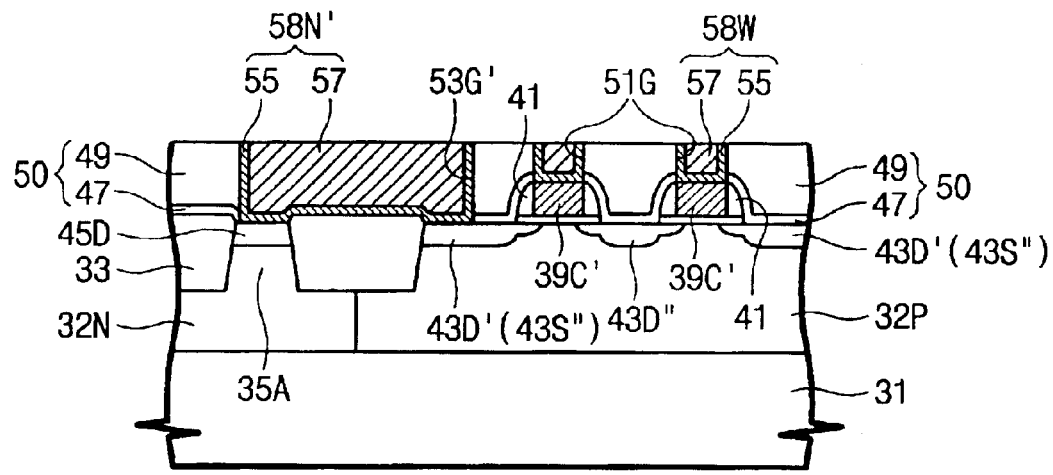
Figure 8C:
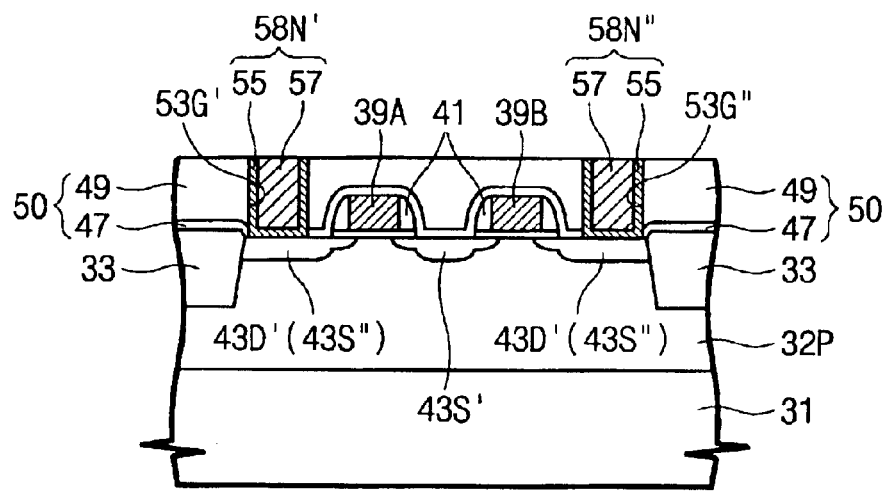
Figure 9B:
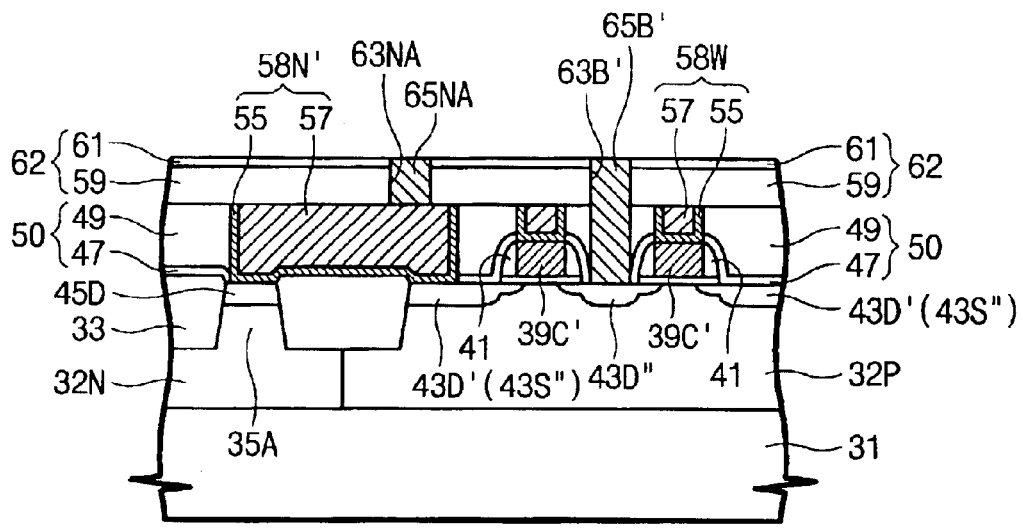
Figure 9C:
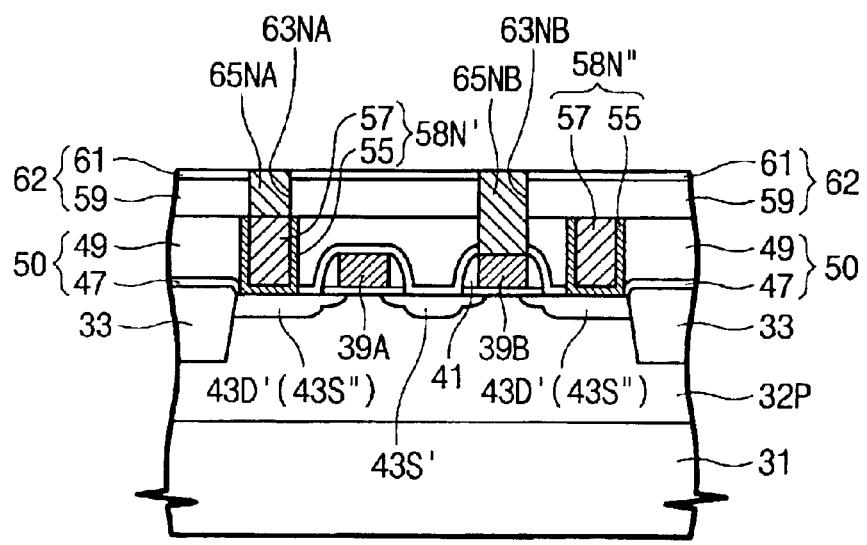
Figure 10A:
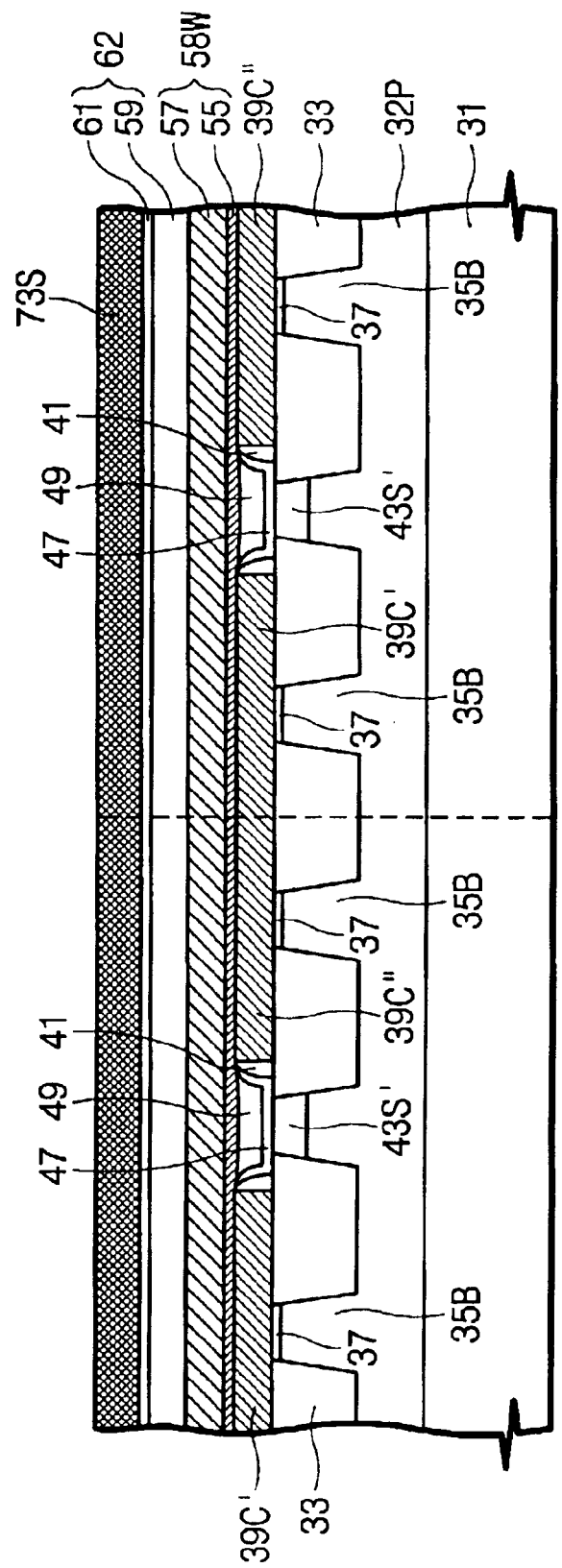
Figure 10B:
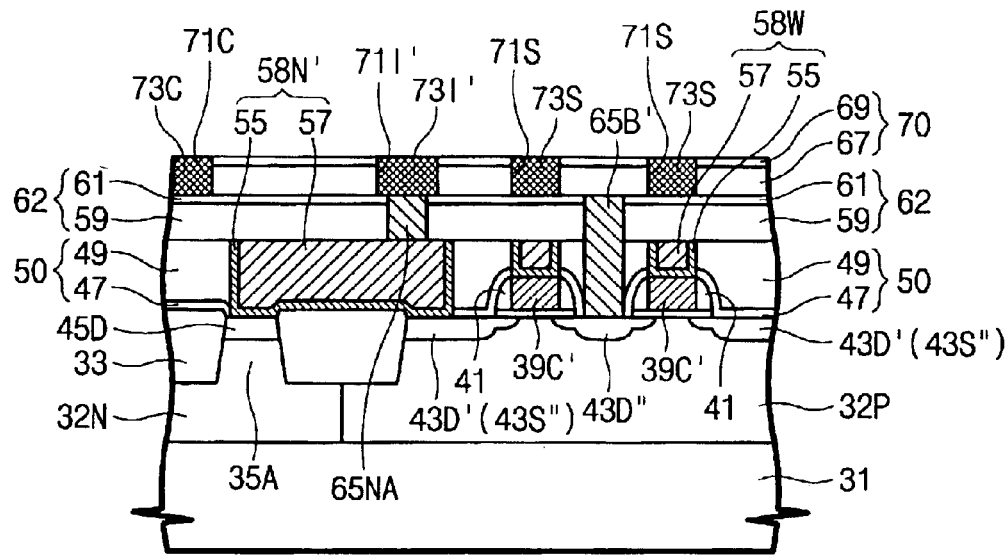
Figure 10C:
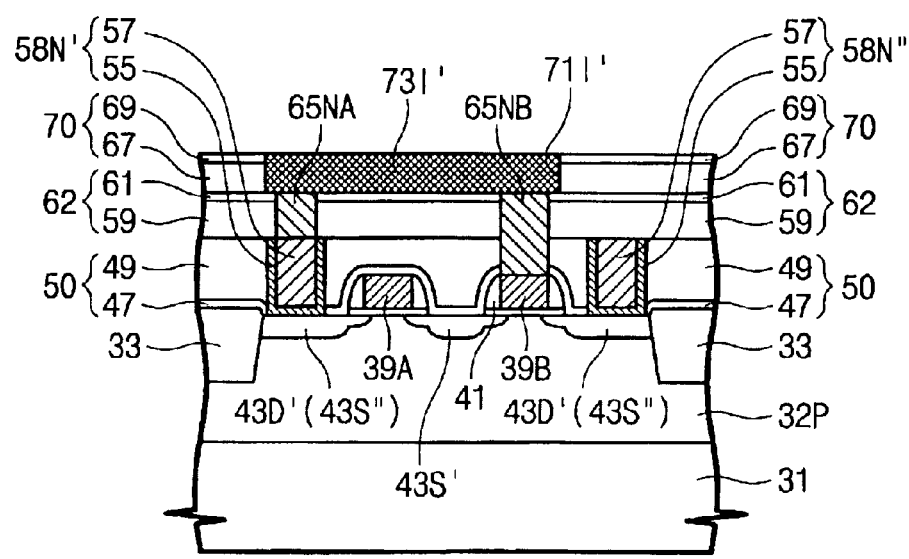
Figure 11A:
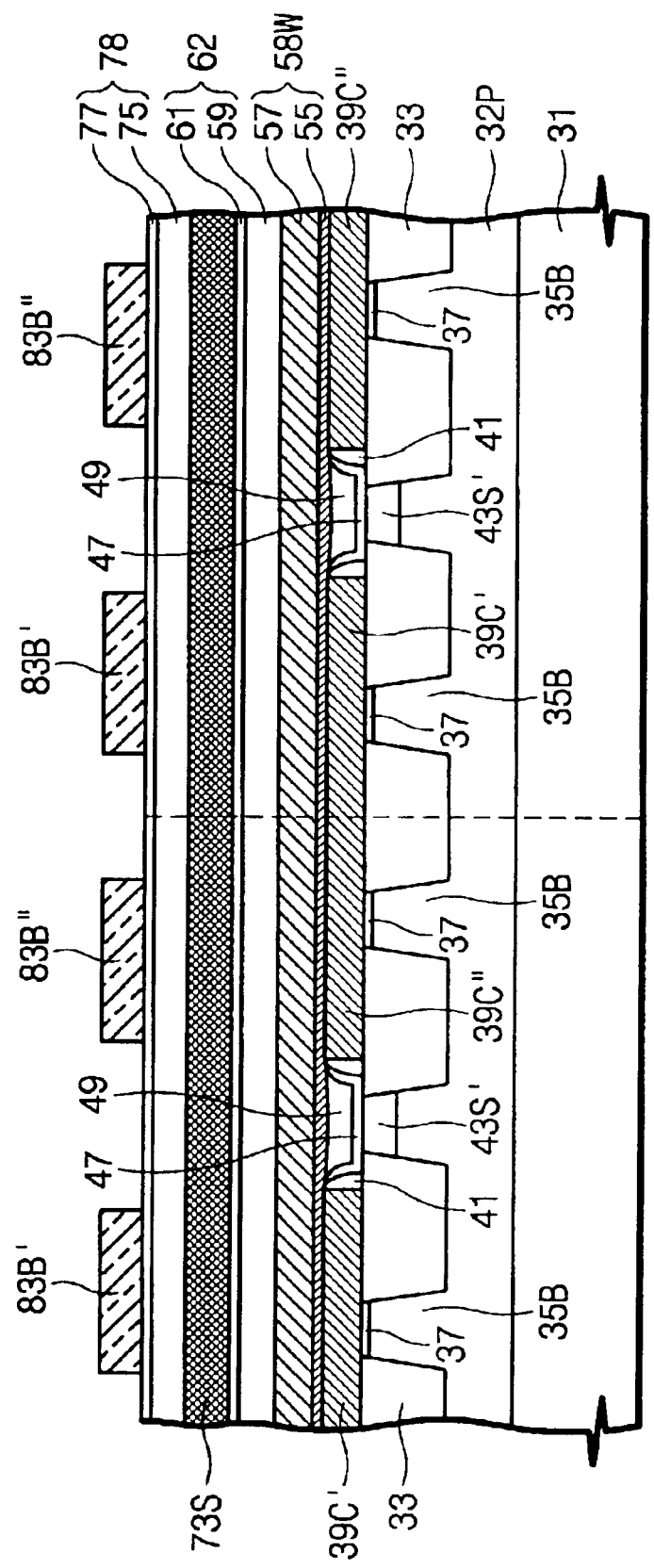
Figure 11B:
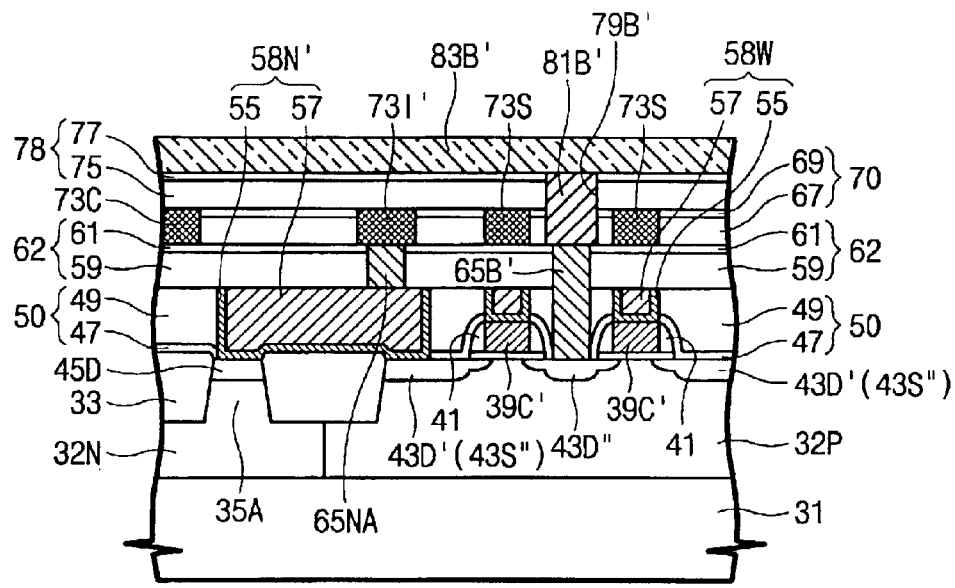
Figure 11C:
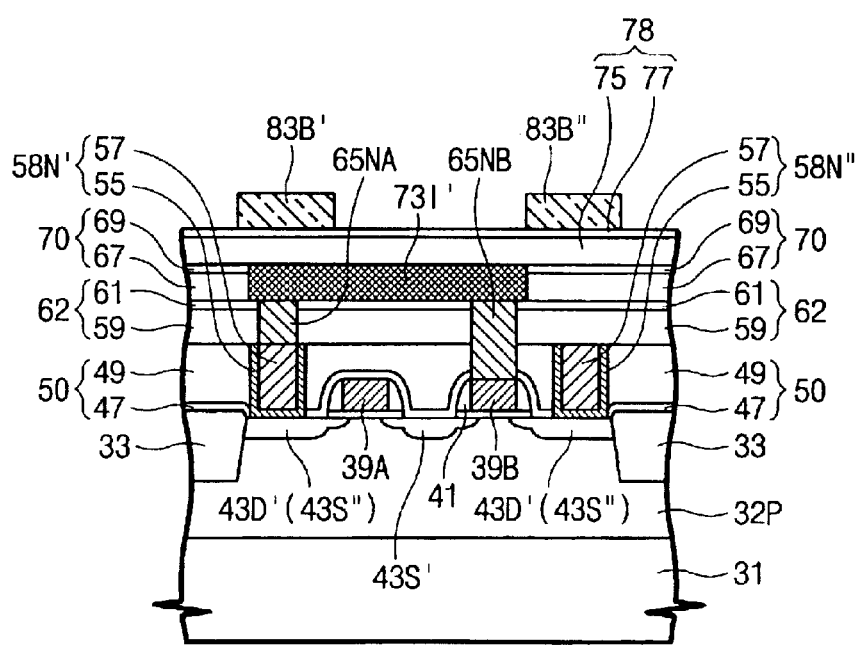

Referring to FIG. 6, first and second bitline contact holes 79B' and 79B" are disposed on the first and second bitline pad contact holes 63B' and 63B", respectively. The first and second bitline contact holes 79B' and 79B" may be filled with first and second bitline contact plugs, respectively.

First and second bitlines 83B' and 83B" are disposed to cross over the power line 73C and the ground line 73S. The first bitline 83B' covers the first bitline contact hole 79B', and the second bitline 83B" covers the second bitline contact hole 79B". Therefore, the first bitline 83B' is electrically connected to an end of the first transfer transistor active region, i.e., a drain region of the first transfer transistor TA1, through the first bitline contact hole 79B' and the first bitline pad contact hole 63B'. Similarly, the second bitline 83B" is electrically connected to an end of the second transfer transistor active region, i.e., a drain region of the second transfer transistor TA2, through second bitline contact hole 79B" and the second bitline pad contact hole 63B".

A method of fabricating a full CMOS SRAM cell according to embodiments of the present invention will be described more fully hereinafter. Referring to FIG. 2, FIG. 7A, FIG. 7B, and FIG. 7C, a P-well 32P and an N-well 32N are formed parallel to each other in a semiconductor substrate 31. A device isolation layer 33 is formed in the resultant structure to define first and second active regions 35A and 35B. The P-well 32P and the N-well 32N may be formed after formation of the device isolation layer 33. The first active region 35A is formed in the N-well 32N. The second active region 35B is formed in the P-well 32P. The device isolation layer 33 may be formed by a conventional device isolation technique such as, for example, a shallow trench isolation (STI) technique. A gate insulating layer 37 is formed on a surface of the first and second active regions 35A and 35B. A first conductive layer is blanket formed on a surface of a semiconductor substrate including the gate insulating layer 37. The first conductive layer may, for example, be made of doped polysilicon or refractory metal polycide.

The first conductive layer is patterned to form first and second gate electrodes 39A and 39B crossing over the first and second active regions 35A and 35B and concurrently to form third and fourth gate electrodes 39C' and 39C" crossing over first and second regions of the second active region 35B. The first and second gate electrodes 35A and 35B are parallel to each other. The third and fourth gate electrodes 35C' and 35B" are perpendicular to the first and second gate electrodes 35A and 35B. The first gate electrode 39A acts as a common gate electrode of the first load transistor (TL1 of FIG. 1) and the first driver transistor (TD1 of FIG. 1). The second gate electrode 39B acts as a common gate electrode of the second load transistor (TL2 of FIG. 1) and the second driver transistor (TD2 of FIG. 1). The third gate electrode 39C' acts as a gate electrode of the first transfer transistor (TA1 of FIG. 1). The fourth gate electrode 39C" acts as a gate electrode of the second transfer transistor (TA2 of FIG. 1).

Referring to FIG. 3, FIG. 8A, FIG. 8B, and FIG. 8C, using the first through fourth gate electrodes 39A, 39B, 39C', and 39C" and the device isolation layer 33 as ion implanting masks, N-type impurities are implanted into the second active region 35B to form lightly doped N-type source/drain regions. Using the first and second gate electrodes 39A and 39B and the device isolation layer 33 as ion implanting masks, P-type impurities are then implanted into the first active region 35A to form lightly doped P-type source/drain regions. Spacers 41 are formed on sidewalls of the first through fourth gate electrodes 39A, 39B, 39C', and 39C" in a conventional manner. In some embodiments, a gate insulating layer 37 remaining on the lightly doped source/drain regions is overetched to expose the lightly doped source/drain regions.

Using the first through fourth gate electrodes 39A, 39B, 39C', and 39C", the device isolation layer 33, and the spacers 41 as ion implanting masks, N-type impurities are implanted into the second active region 35B to form heavily doped N-type source/drain regions. Using the first and second gate electrodes 39A and 39B, the device isolation layer 33, and the spacers 41 as ion implanting masks, P-type impurities are implanted into the first active region 35A to form heavily doped P-type source/drain regions. As a result, P-type source/drain regions having a lightly doped drain (LDD) shape are formed at the first active region 35A, and N-type source/drain regions having an LDD shape are formed at the second active region.

More specifically, a common source region of first and second driver transistors TD1 and TD2, i.e., N-type ground source region 43S' is formed at the second active region 35B between the first and second gate electrodes 39A and 39B. Similarly, a drain region 43D' of a second driver transistor TD2 is formed at the second active region 35B between the second and fourth gate electrodes 39B and 39C". The drain regions 43D' of the first and second driver transistors TD1 and TD2 correspond to source regions 43S" of first and second transfer transistors TA1 and TA2. Drain regions 43D" of the first and second transfer transistors TA1 and TA2 are formed at both ends of the second active region 35B. A common source region of the first and second load transistors TL1 and TL2, i.e., a power source region (not shown) is formed at a first active region 35A between the first and second gate electrodes 39A and 39B. In addition, drain regions 45D of the first and second load transistors TL1 and TL2 are formed at both ends of the first active region 35A.

A first interlayer insulating layer 50 is blanket formed on the surface of a semiconductor substrate having the above source/drain regions. In certain embodiments, the first interlayer insulating layer 50 may be formed by sequentially providing an etch-stop layer 47 and a first insulating layer 49. The etch-stop layer 47 may be made of an insulator having an etch selectivity with respect to the first insulating layer 49. For example, the etch-stop layer may be made of silicon nitride and the first insulating layer 49 may be made of silicon oxide. In addition, the first interlayer insulating layer 50 may further include a polishing stop layer (not shown) on the first insulating layer 49.

The first interlayer insulating layer 50 is patterned to form a wordline groove 51G exposing top surfaces of the third and fourth gate electrodes 39C' and 39C". The wordline groove 51G is formed across a plurality of cells that are adjacent to one another. The first interlayer insulating layer 50 is patterned again to form first and second node line grooves 53G' and 53G". The first node line groove 53G' exposes the drain region 45D of the first load transistor TL1, the drain region 43D' of the first driver transistor TD1, and the device isolation layer 33 therebetween. The second node line groove 53G" exposes the drain region 45D of the second load transistor TL2, the drain region 43D' of the second driver transistor TD2, and the device isolation layer 33 therebetween. Thus, the first and second node line grooves 53G' and 53G" are deeper than the wordline groove 51G.

A second conductive layer is blanket formed on the surface of the resulting structure where the first and second node line grooves 53G' and 53G" and the wordline groove 51G are formed to fill the grooves 53G', 53G", and 51G. Preferably, the second conductive layer is formed by sequentially stacking a barrier metal layer 55 and a metal layer 57. The barrier metal layer 55 may be made of metal nitride such as tungsten nitride (WN) or titanium nitride (TiN). In particular embodiments of the present invention, the metal layer is made of tungsten.

The second conductive layer is planarized down to the top surface of the first interlayer insulating layer 50 to form first and second node lines 58N' and 58N" and a straight wordline 58W. The first and second node lines 58B' and 58N" are formed in the first and second node line grooves 53G' and 53G", respectively. The straight wordline 58W is formed in the wordline groove 51G. Thus, the drain region 45D of the first load transistor TL1 is electrically connected to the drain region 43D' of the first driver transistor TD1 through the first node line 58N'. Similarly, the drain region 45D of the second load transistor TL2 is electrically connected to the drain region 43D' of the second driver transistor TD2 through the second node line 58N". As a result, a first inverter comprising the first driver transistor TD1 and the first load transistor TL1 and a second inverter comprising the second driver transistor TD2 and the second load transistor TL2 are constructed in one cell.

Also, top surfaces of the third and fourth gate electrodes 39C' and 39C" are in direct contact with the wordline 58W. This may make it possible to reduce or minimize the contact resistance between the wordline 58W and the third gate electrode 39C' and the contact resistance between the wordline 58W and the fourth gate electrode 39C".

Referring to FIG. 4, FIG. 9A, FIG. 9B, and FIG. 9C, a second interlayer insulating layer 62 is blanket formed on a surface of a semiconductor substrate having the first and second node lines 58N' and 58N" and the wordline 58W. Preferably, the second interlayer insulating layer 62 is formed by sequentially stacking a second insulating layer 59 and a first polishing stop layer 61. The second insulating layer 59 may be made of silicon oxide, and the first polishing stop layer 61 may be made of silicon nitride. The second interlayer insulating layer 62 and the first interlayer insulating layer 50 are consecutively patterned to form first through fourth node contact holes 63NA, 63NB, 63NC, and 63ND, first and second bitline pad contact holes 63B' and 63B", a power line contact hole 63C, and a ground line contact hole 63S.

The first node contact hole 63NA exposes a predetermined region of the first node line 58N'. The second node contact hole 63NB exposes a predetermined region of the second gate electrode 39B. The third node contact hole 63NC exposes a predetermined region of the second node line 58N". The fourth node contact hole 63ND exposes a predetermined region of the first gate electrode 39A. In addition, the first bitline pad contact hole 63B' exposes the drain region 43D" of the first transfer transistor TA1. The second bitline pad contact hole 63B" exposes the drain region 43D" of the second transfer transistor TA2. The power line contact hole (63C of FIG. 4) exposes the power source line (not shown). The ground line contact hole (63S of FIG. 4) exposes the ground source region 43S'. The first and second bitline pad contact hole 63B' and 63B", the power line contact hole, and the ground line contact hole are shared by two cells that are adjacent to each other.

On a surface of a semiconductor substrate including the plurality of the contact holes, a third conductive layer is blanket formed to fill the plurality of the contact holes. The third conductive layer may be formed by sequentially stacking a barrier metal layer and a metal layer. The third conductive layer is planarized down to a top surface of the first polishing stop layer 61 to form first through fourth node contact plugs 65NA, 65NB, 65NC, and 65ND, first and second bitline pads 65B' and 65B", a power line contact plug (not shown), and a ground line contact plug (not shown). The first through fourth node contact plugs 65NA, 65NB, 65NC, and 65ND are formed in first through fourth node contact holes 63NA, 63NB, 63NC, and 63ND, respectively. The first and second bitline pads 65B' and 65B" are formed in the first and second bitline pad contact holes 63B' and 63B", respectively. The power line contact plug is formed in the power line contact hole. The ground line contact plug is formed in the ground line contact hole. Preferably, a process for planarizing the third conductive layer is performed by means of a chemical mechanical polishing (CMP) process.

Referring to FIG. 5, FIG. 10A, FIG. 10B, and FIG. 10C, a third interlayer insulating layer 70 is blanket formed on the surface of the semiconductor substrate including the above contact plugs. The third interlayer insulating layer 70 may be formed by sequentially stacking a third insulating layer 67 and a second polishing stop layer 69. The third insulating layer 67 may be made of silicon oxide, and the second polishing stop layer 69 may be made of silicon nitride. The third interlayer insulating layer 70 is patterned to form a first local interconnection groove 71I', a second local interconnection groove (not shown), a power line groove 71C, and a ground line groove 71S. The first local interconnection groove 71I' exposes the first and second node contact plugs 65NA and 65NB and a second interlayer insulating layer 62 therebetween. The second local interconnection groove exposes the third and fourth contact plugs 65NC and 65ND and a second interlayer insulating layer therebetween. The power line groove 71C exposes the power line contact plug and is parallel to the wordline 58W. The power line groove 71C is shared by two cells that are adjacent to each other. The ground line groove 71S is formed over the wordline 58W. A predetermined region of the ground line groove 71S extends to expose the ground line contact plug. Thus, two parallel ground line grooves 71S are formed on two cells that are adjacent to each other. The two ground line grooves 71S are linked through an extension exposing the ground line contact plug.

A fourth conductive layer is blanket formed on a surface of a semiconductor substrate having the first and second local interconnection grooves, the power line groove 71C, and the ground line groove 71S. The fourth conductive layer is then planarized down to a top surface of the second polishing stop layer 69 to form a power line 73C, first and second local interconnections 73I' and 73I", and a ground line 73S. Preferably, a process for planarizing the fourth conductive layer is performed by means of a chemical mechanical polishing (CMP) process. The power line 73C is formed in the power line groove 71C and is shared by two cells that are adjacent to each other. The first and second local interconnection 73I' and 73I" are formed in the first and second local interconnection grooves, respectively. The ground line 73S is formed in the ground line groove 71S.

As shown in FIG. 5, two ground lines 73S, formed on two cells that are adjacent to each other, are interconnected through the ground line contact hole (63S of FIG. 5) shared by the two cells. Thus, the equivalent resistance of the ground line connected to each cell may be reduced which may improve a low voltage characteristic of a cell. Further, the first and second inverters are cross-coupled using two conductive layers. That is, the fist and second inverters are cross-coupled by the first and second node lines 58N' and 58N" formed of the second conductive layer as well as the first and second local interconnections 73I' and 73I" formed of the fourth conductive layer. As a result, a more compact cell can be realized over a conventional SRAM cell cross-coupling a pair of inverters using one conductive layer.

Referring to FIG. 6, FIG. 11A, FIG. 11B, and FIG. 11C, a fourth interlayer insulating layer 78 is blanket formed on the surface of a semiconductor substrate including the first and second local interconnections 73I' and 73I", the ground lines 73S, and the power lines 73C. In certain embodiments of the present invention, the fourth interlayer insulating layer 78 is formed by sequentially stacking a fourth insulating layer 75 and a third polishing stop layer 77. The fourth and third interlayer insulating layers 78 and 70 are consecutively patterned to form first and second bitline contact holes 79B' and 79B" respectively exposing the first and second bitline pads 65B' and 65B". A fifth conductive layer is blanket formed on the surface of a semiconductor substrate including the first and second bitline contact holes 79B' and 79B". The fifth conductive layer is planarized down to a top surface of the third polishing stop layer 77 to form a first bitline contact plug 81B' and a second bitline contact plug (not shown) in the first and second bitline contact holes 79B' and 79B", respectively.

A sixth conductive layer, for example, a metal layer is blanket formed on a surface of the above resultant structure. The sixth conductive layer is patterned to form first and second bitlines 83B' and 83B" crossing over the first and second local interconnections 73I' and 73I". The first bitline 83B' covers the first bitline contact plug 81B', and the second bitline 83B" covers the second bitline contact plug.

In further embodiments of the present invention, the fourth through sixth conductive layers may be formed by sequentially stacking a barrier metal layer and a metal layer. The barrier metal layer may be made of titanium, titanium nitride, titanium/titanium nitride, tantalum, tantalum nitride or tantalum/tantalum nitride. The metal layer may be made of aluminum, tungsten or copper.

In some embodiments of the present invention, first and second node lines as well as first and second local interconnections are effectively disposed to realize a compact cell. In other embodiments of the present invention, a straight wordline that is in direct contact with top surfaces of first and second transfer gate electrodes is disposed to reduce or minimize the RC delay time that results from a wordline. Thus, an SRAM device having a fast access time can be realized. In addition, two ground lines are shared by two cells that are adjacent to each other. Therefore, the equivalent resistance of the ground line connected to each cell may be reduced or minimized which may improve low voltage characteristics of the cell.

While the invention has been described with reference to specific embodiments, it should be clearly understood that various modifications will be apparent to and can readily be made by those skilled in the art without departing from the scope of the present invention. Accordingly, it is not intended that the present invention should merely be restricted to the specific embodiments described hereinabove but should also include features treated as equivalents thereof by those skilled in the art.

What is claimed is:

1. An SRAM cell comprising:
   a semiconductor substrate;
   first and second active regions in the semiconductor substrate, the first active region each having a first end and a second end, opposite the first end;
   a first gate electrode on the first and second active regions, the first gate electrode being adjacent the first end of the first active region;
   a second gate electrode on the first and second active regions, the second gate electrode being substantially parallel to the first gate electrode and being adjacent the second end of the first active region;
   a first node line configured to electrically connect the first end of the first active region to the second active region adjacent to the first gate electrode, the first node line being substantially parallel to the first gate electrode;
   a second node line configured to electrically connect the second end of the first active region to the second active region adjacent to the second gate electrode, the second node line being substantially parallel to the second gate electrode;
   a first local interconnection configured to electrically connect the first node line to the second gate electrode; and
   a second local interconnection configured to electrically connect the second node line to the first gate electrode.

2. The SRAM cell of claim 1, wherein the first and second node lines are in contact with a top surface of a device isolation layer between the first and second active regions.

3. The SRAM cell of claim 1, wherein a first end of the first local interconnection is configured to electrically connect to the first node line utilizing a first node contact hole exposing a predetermined region of the first node line, and a second end of the first local interconnection opposite the first end of the first local interconnection is configured to electrically connect to the second gate electrode utilizing a second node contact hole exposing a predetermined region of the second gate electrode.

4. The SRAM cell of claim 3, further comprising:
   a first node contact plug filling the first node contact hole; and
   a second node contact plug filling the second node contact hole.

5. The SRAM cell of claim 3, wherein the second node contact hole is configured to have a portion that overlaps the second active region.

6. The SRAM cell of claim 1, wherein a first end of the second local interconnection is electrically connected to the second node line through a third node contact hole exposing a predetermined region of the second node line, and a second end of the second local interconnection opposite the first end of the second local interconnection is electrically connected to the first gate electrode through a fourth node contact hole exposing a predetermined region of the first gate electrode.

7. The SRAM cell of claim 6, further comprising:
   a third node contact plug filling the third node contact hole; and
   a fourth node contact plug filling the fourth node contact hole.

8. The SRAM cell of claim 6, wherein the fourth node contact hole is configured to have a portion that overlaps the first active region.

9. The SRAM cell of claim 1, wherein the first active region has a portion between the first and second gate electrodes that is configured to extend to a neighboring cell.

10. The SRAM cell of claim 9, further comprising a power line contact hole exposing the portion of the first active region that is configured to extend to a neighboring cell, the power line contact hole being shared by the SRAM cell and the neighboring cell.

11. The SRAM cell of claim 1, wherein the second active region comprises:
   a first extension configured to extended from a part of the second active region electrically connected to the first node line in a direction opposite the first active region;
   a second extension configured to extend from a part of the second active region electrically connected to the second node line in a direction opposite the first active region; and
   a third extension configured to extend from the second active region between the first and second gate electrodes in a direction opposite the first active region.

12. The SRAM cell of claim 11, further comprising a straight wordline crossing over the first and second extensions, the straight wordline being disposed parallel to the first and second local interconnections.

13. The SRAM cell of claim 11, wherein the first extension has a portion that is configured to extend to a neighboring cell and wherein the second extension has a portion that is configured to extend to the neighboring cell, the CMOS SRAM cell further comprising:
   a first bitline pad contact hole exposing the portion of the first extension that is configured to extend to the neighboring cell, the first bitline pad contact hole being shared by the SRAM cell and the neighboring cell; and
   a second bitline pad contact hole exposing the portion the second extension that is configured to extend to the neighboring cell, the second bitline pad contact hole being shared by the SRAM cell and the neighboring cell.

14. The SRAM cell of claim 11, wherein the third extension has a portion that is configured to extend to a neighboring cell, the CMOS SRAM cell further comprising a ground line contact hole exposing the portion of the third extension that is configured to extend to the neighboring cell, the ground line contact hole being shared by the SRAM cell and the neighboring cell.

15. An SRAM cell comprising:
   a semiconductor substrate
   a first active region disposed in the semiconductor substrate;
   a second active region disposed to be adjacent to the first active region, the second active region including a driver transistor active region parallel to the first active region and first and second transfer transistor active regions extending from opposite ends of the driver transistor active region in a direction opposite the first active region;
   a first gate electrode on the first active region and the driver transistor active region;
   a second gate electrode on the first active region and the drive transistor active region, the second gate electrode being substantially parallel to the first gate electrode;
   a straight wordline on the first and second transfer transistor active regions, the straight wordline being substantially perpendicular to the first and second gate electrodes;
   a third gate electrode disposed between the wordline and the first transfer transistor active region, the third gate electrode being in direct contact with a bottom surface of the wordline; and
   a fourth gate electrode disposed between the wordline and the second transfer transistor active region, the fourth gate electrode being in direct contact with the bottom surface of the wordline.

16. The SRAM cell of claim 15, further comprising:
   a first node line configured to electrically connect a first end of the first active region adjacent to the first gate electrode to the second active region between the first and third gate electrodes, the first node line being disposed parallel to the first gate electrode;
   a second node line configured to electrically connect a second end of the first active region adjacent to the second gate electrode to the second active region between the second and fourth gate electrodes, the second node line being disposed parallel to the second gate electrode;
   a first local interconnection configured to electrically connect the first node line to the second gate electrode, the first local interconnection crossing over the first node line and the second gate electrode; and
   a second local interconnection configured to electrically connect the second line to the first gate electrode, the second local interconnection crossing over the second node line and the first gate electrode.

17. The SRAM cell of claim 16, wherein the first and second node lines are in contact with a top surface of a device isolation layer between the first and second active regions.

18. The SRAM cell of claim 16, wherein a first end of the first local interconnection is configured to electrically connect to the first node line through a first node contact hole exposing a predetermined region of the first node line, and a second end of the first local interconnection is configured to electrically connect to the second gate electrode through a second node contact hole exposing a predetermined region of the second gate electrode.

19. The SRAM cell of claim 18, wherein the first and second node contact holes are include first and second node contact plugs therein, respectively.

20. The SRAM cell of claim 18, wherein a part of the second node contact hole is disposed to overlap the second active region.

21. The SRAM cell of claim 16, wherein one end of the second local interconnection is configured to electrically connect to the second node line through a third node contact hole exposing a predetermined region of the second node line, and the other end of the second local interconnection is configured to electrically connect to the first gate electrode through a fourth node contact hole exposing a predetermined region of the first gate electrode.

22. The SRAM cell of claim 21, wherein the third and fourth node contact holes include third and fourth node contact plugs therein, respectively.

23. The SRAM cell of claim 21, wherein the fourth node contact hole overlaps a portion of the first active region.

24. The SRAM cell of claim 15, wherein the first active region has a portion between the first and second gate electrodes configured to extend to a neighboring cell.

25. The SRAM cell of claim 24, further comprising a power line contact hole configured to expose the portion of the first active region configured to extend to a neighboring cell, the power line contact hole being configured to be shared by the cell and the neighboring cell.

26. The SRAM cell of claim 15, wherein the second active region further comprises a ground source region extending from the second active region between the first and second gate electrodes in a direction opposite the first active region, wherein the third and fourth gate electrodes are disposed on opposite sides of the ground source region.

27. The SRAM cell of claim 15, further comprising:

a first bitline pad contact hole exposing a portion of the first transfer transistor active region, the first bitline pad contact hole being configured to be shared by the cell and a neighboring cell; and a second bitline pad contact hole exposing a portion of the second transfer transistor active region, the second bitline pad contact hole being configured to be shared by the cell and a neighboring cell.

28. The SRAM cell of claim 26, further comprising a ground line contact hole exposing a portion of the ground source region, the ground line contact hole being configured to be shared by the cell and a neighboring cell.

29. An SRAM cell comprising:

a semiconductor substrate;

a first active region disposed in the semiconductor substrate;

a second active region adjacent the first active region, the second active region including a driver transistor active region substantially parallel to the first active region, a ground source region extending from a center region of the driver transistor active region in a direction opposite the first active region, and first and second transfer active regions extending from opposite ends of the driver transistor active region in a direction opposite the first active region;

a ground line contact hole exposing a portion of the ground source region, the ground line contact hole being configured to be shared by the cell and a neighboring cell; and a ground line crossing over the first and second transfer transistor active regions, the ground line having a portion that extends to cover the ground line contact hole and electrically connect to the ground source region through the ground line contact hole, the portion being further configured to electrically connect to a ground line of a neighboring cell.

30. The SRAM cell of claim 29, further comprising:

first and second gate electrodes crossing over the first active region and the driver transistor active region, the first and second gate electrodes being disposed on opposite sides of the ground source region;

a third gate electrode crossing over the first transfer transistor active region, the third gate electrode being disposed under the ground line;

a fourth gate electrode crossing over the second transfer transistor active region, the fourth gate electrode being disposed under the ground line and separated from the third gate electrode; and a straight wordline crossing over the first and second transfer transistor active regions, the straight wordline being in direct contact with top surfaces of the third and fourth gate electrodes and disposed under the ground line.

31. The SRAM cell of claim 30, wherein the first active region has a first end and a second end, opposite the first end, the cell further comprising:

a first node line configured to electrically connect the first end of the first active region adjacent to the first gate electrode to the second active region between the first and third gate electrodes, the first node line being disposed substantially parallel to the first gate electrode;

a second node line configured to electrically connect the second end of the first active region adjacent to the second gate electrode to the second active region between the second and fourth gate electrodes, the second node line being disposed substantially parallel to the second gate electrode;

a first local interconnection configured to electrically connect the first node line to the second gate electrode, the first local interconnection crossing over the first node line and the second gate electrode; and a second local interconnection configured to electrically connect the second node line to the first gate electrode, the second local interconnection crossing over the second node line and the first gate electrode.

32. The SRAM cell of claim 31, wherein a first end of the first local interconnection is configured to electrically connect to the first node line through a first node contact hole exposing a predetermined region of the first node line, and a second end of the first local interconnection is configured to electrically connect to the second gate electrode through a second node contact hole exposing a predetermined region of the second gate electrode.

33. The SRAM cell of claim 32, further comprising a first node contact plug in the first node contact hole and a second node contact plug in the second node contact hole.

34. The SRAM cell of claim 32, wherein the second node contact hole is disposed to overlap a portion of the second active region.

35. The SRAM cell of claim 31, wherein one end of the second local interconnection is electrically connected to the second node line through a third node contact hole exposing a predetermined region of the second node line, and the other end of the second local interconnection is electrically connected to the first gate electrode through a fourth node contact hole exposing a predetermined region of the first gate electrode.

36. The SRAM cell of claim 35, further comprising a third node contact plug in the third node contact hole and a fourth node contact plug in the fourth node contact hole.

37. The SRAM cell of claim 35, wherein the fourth node contact hole is disposed to overlap a portion of the first active region.

38. The SRAM cell of claim 30, wherein a portion of the first active region is configured to extend to a neighboring cell between the first and second gate electrodes.

39. The SRAM cell of claim 38, further comprising a power line contact hole exposing the portion of the first active region configured to extend to the neighboring cell, the power line contact hole being configured to be shared by the cell and the neighboring cell.

40. The SRAM cell of claim 29, further comprising:

a first bitline pad contact hole exposing a portion of the first transfer transistor active region; and a second bitline pad contact hole exposing a portion of the second transfer transistor active region.

* * * * *